United States Patent [19]

Jansen et al.

[11] Patent Number: 5,073,785
[45] Date of Patent: Dec. 17, 1991

[54] COATING PROCESSES FOR AN INK JET PRINTHEAD

[75] Inventors: Frank Jansen, Webster; Daniel E. Kuhman, Fairport, both of N.Y.

[73] Assignee: Xerox Corporation, Stamford, Conn.

[21] Appl. No.: 516,660

[22] Filed: Apr. 30, 1990

[51] Int. Cl.$^5$ .............................................. B41J 2/14
[52] U.S. Cl. ................................ 346/1.1; 346/140 R; 427/38; 427/255.2
[58] Field of Search ........................ 346/1.1, 140 R; 427/38–41, 204, 249, 255.2

[56] References Cited

U.S. PATENT DOCUMENTS

| | | | |
|---|---|---|---|
| 4,335,389 | 6/1982 | Shirato et al. | 346/140 R |
| 4,368,476 | 1/1983 | Uehara et al. | 346/140 R |
| 4,639,948 | 1/1987 | Drake et al. | 346/140 R |
| 4,643,948 | 2/1987 | Diaz et al. | 428/422 |
| 4,661,409 | 4/1987 | Kieser et al. | 428/408 |
| 4,663,640 | 5/1987 | Ikeda | 346/140 R |
| 4,698,256 | 10/1987 | Giglia et al. | 428/216 |
| 4,740,263 | 4/1988 | Imai et al. | 156/613 |
| 4,770,966 | 9/1988 | Kazama et al. | 430/66 |
| 4,847,639 | 7/1989 | Sugata et al. | 346/140 R |
| 4,864,329 | 9/1989 | Kneezel et al. | 346/140 R |

OTHER PUBLICATIONS

Xerox Disclosure Journal, "Metal Cleaning Blade with Diamond Coating", P. F. Morgan, vol. 14, No. 1, Jan.-/Feb. 1989.

Primary Examiner—Benjamin R. Fuller
Assistant Examiner—Victor DeVito
Attorney, Agent, or Firm—E. O. Palazzo

[57] ABSTRACT

A process for minimizing or avoiding drop deflection in ink jet devices which involves coating the ink jet head components with amorphous carbon and subsequently subjecting the amorphous carbon to fluorination in which results in a fluorine surface layer present on the amorphous carbon coating to prevent ink drop deflection.

18 Claims, 1 Drawing Sheet

COATING PROCESSES FOR AN INK JET PRINTHEAD

BACKGROUND OF THE INVENTION

This invention is generally directed to coating processes, and more specifically to the coating of various components in an imaging and printing apparatus. More specifically, the present invention is directed to the coating of ink jet print heads and the like in printing apparatus, which coatings are abrasion resistant and enable the minimization or elimination of undesirable ink drop deflection which can, and in many instances does causes poor image quality. In one embodiment of the present invention the coating selected is comprised of amorphous carbon, also referred to as diamond-like carbon. This material may contain hydrogen, halogen, especially fluorine, mixtures thereof throughout the coating layer or as a layer at the exposed surface of the coating.

Printing methods utilizing ink jet technologies are well known and ink jet printers are commercially available from, for example, Xerox Corporation as the ink jet printer Model 4020 TM. Also, there is illustrated, for example, in U.S. Pat. No. 4,335,389; 4,392,907 and 4,794,410, the disclosures of which are totally incorporated herein by reference, a particular ink jet printing technology which is based on thermal rather than electrostatic ink acceleration methods. Ink jet printing methods generally involve the physical separation of a predetermined and metered quantity of ink, which could be a dye based or a pigmented fluid material, from an orifice. The specific details of this process, the separation of the fluid ink from its physical surroundings, the ink channel and its orifice, determines to a large extent the direction in which the ink will travel to the paper and thus determine where the mark on the paper will be made. Any microscopic irregularity that would affect the isotropy of this ink-orifice separation process will usually cause the ink to travel in an uncontrolled and not intended direction, that is, for example, not orthogonal to the plane defined by the orifice. This results in poor quality of the images and text that is printed on the paper. The processes of this invention avoid or minimize the aforementioned problem and, more specifically, enables the minimization or elimination of the effects of such microscopic anisotropies of the orifice. In one embodiment of the present invention this is accomplished by the provision of coatings of the exit orifice, which coatings have the property that they repel the ink that is used for the printing process. This repellent property is a quantifiable physical property that is commonly expressed in terms of the contact angle that a small ink droplet forms with this coating. A large contact angle of, for instance, more than 90° indicates a repellent nature of the coating with the ink and smaller contact angles of, for instance, less than 85° indicate that the ink will cover ("wet") the coating. The processes of the present invention provide coating formulations that have a phobic or a shunning property for many dye and water-based ink formulations, including those that are commercially available from E.I. DuPont de Nemours, Inc. One object of the present invention is to provide coatings that are mechanically suitable for the aforementioned coating applications in that the phobic effect is retained and does not wear off for an extended time period in the ink jet printing devices, that is for example wearing can be caused, for example, by chemical reactions or mechanical abrasion even though the coating is continuously or intermittently exposed to the passage of ink drops through the opening. Specifically, the combination of properties of repulsion and extended werability is obtained by the provision of coatings known as diamond-like or amorphous carbon layers. These coatings are substantially composed of carbon containing from about 1 to about 60 percent, and preferably from about 1 to about 40 weight percent, of monovalent elements such as hydrogen, halogen, such as fluorine, chlorine, or mixtures thereof, either homogeneously present throughout the layer or present on the surface of the carbon coating.

Other thermal ink jet printing processes and apparatuses wherein the coatings of the present invention may be selected are illustrated in U.S. Pat. Nos. 4,639,748; 4,864,329 and Re. 32,572, the disclosures of each of the aforementioned patents being totally incorporated herein by reference.

Illustrated in copending application U.S. Ser. No. 504,224, filed on 04/04/90, entitled Surface Hardening of Reprographic Machine Components by Coating or Treatment Processes, the disclosure of which is totally incorporated herein by reference, is a process for maximizing wear resistance of electrophotographic components which comprises coating the components with a diamond-like amorphous carbon material, a titanium compound, or mixtures thereof.

SUMMARY OF THE INVENTION

It is, therefore, an object of the present invention to provide processes wherein amorphous carbon films can be selected as the coating for the orifice plane of ink jet heads to avoid or minimize ink drop deflection in ink jet printing apparatuses. The amorphous carbon films may contain monovalent elements such as hydrogen halogens, or mixtures thereof in effective amounts throughout the film or at its surface.

These and other objects of the present invention are accomplished by the provision of coated components. More specifically, the present invention is directed to processes for minimizing or avoiding ink drop deflection in ink jet devices, which comprises coating the ink jet head components with amorphous carbon, hydrogenated amorphous carbon, halogenated amorphous carbon, particularly fluorinated amorphous carbon or mixtures thereof in an embodiment, and the like as illustrated herein. Generally, the coating is present in an effective thickness, including for example from about 1 to about 10 microns and preferably from about 1 to about 5 microns, however, other thicknesses can be selected. In one embodiment of the present invention there may be selected as the coating amorphous carbon, hydrogenated amorphous carbon comprising, for example, from 1 to about 60 weight percent and preferably from 1 to about 40 weight percent of hydrogen or halogenated amorphous carbon including chlorinated and fluorinated amorphous carbon and preferably fluorinated amorphous carbon wherein the halogen is present in an effective amount of, for example, from about 1 to about 40 percent and preferably from about 1 to about 20 weight percent.

In another embodiment of the present invention there is provided a process for avoiding or minimizing the deflection of ink droplets in an ink jet printing apparatus including thermal ink jet printing apparatuses, which process comprises coating the ink jet head components with amorphous carbon or diamond-like carbon prepared by a process which comprises incorporating the substrate to be coated into a deposition chamber; applying a vacuum thereto of, for example, from about 1 mTorr to about 1 Torr; heating the substrate to a temperature of from about room temperature to about 300° C.; incorporating into the deposition chamber a mixture of gases or vapors thereof comprised of at least one carbon containing gas; adjusting the total pressure to an effective amount of, for example, from about 1 mTorr to about 1 Torr; activating, for example, by heating the gas mixture in the plasma formed; and continuing this activation until the coating is generated on the ink jet head.

DETAILED DESCRIPTION OF THE INVENTION

Figure 1:
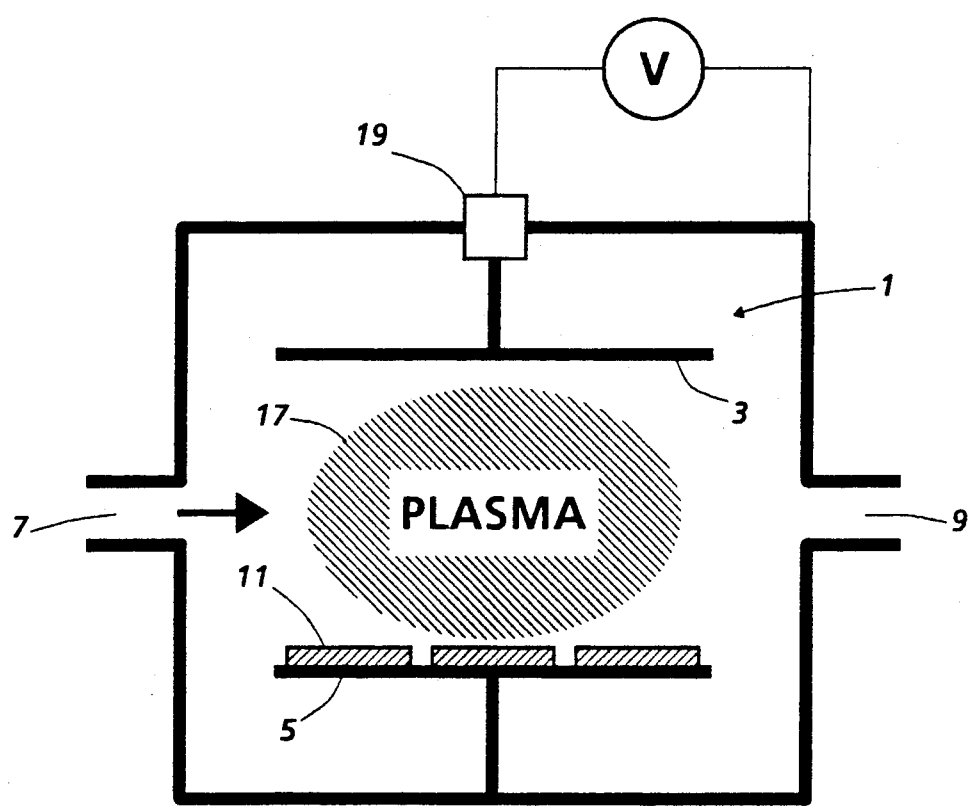

Amorphous carbon films are known, the hard modification of which is termed diamond-like carbon. An extensive overview of the aforementioned materials and processes thereof is illustrated by John C. Angus in Chapter 5 of the book *Plasma Deposited Films*, edited by J. Mort and F. Jansen and published in 1986 by CRC Press, Boca Raton, Fla., the disclosure of which is totally incorporated herein by reference. Apparently, there is, however, no uniform nomenclature to designate these materials. Terms such as amorphous carbon, diamond-like carbon, DLC films, i-carbon and a-C or a-C:H or a-C:F or a-C:H:F are all used to designate a class of films which primarily consists of carbon without long range atomic order. The properties of these carbon films are generally very different from the relatively soft graphitic films obtained when carbon is evaporated. The addition of hydrogen to amorphous carbon to form hydrogenated amorphous carbon (a-C:H) can more profoundly affect its properties. The film density generally decreases when hydrogen is incorporated and may be as low as 1.2 grams/cm$^3$. Depending on the hydrogen concentration, these hydrogenated amorphous carbon films often do not have the superior mechanical characteristics, such as hardness and wear resistance, that are typical of the unhydrogenated material. However, the incorporation of hydrogen relieves some of the high intrinsic film stress, which is typical of an overconstrained unhydrogenated carbon network, and allows the deposition of films thicker than 1 micron. The incorporation of hydrogen at a level of more than 5 percent and up to 60 percent also increases the contact angle of the film with ink jet compositions. Although it is not desired to be limited by theory, it is believed that the increase in contact angle is related to the decrease in the unsaturated bond density at the surface of the carbon film with increasing hydrogen concentration. One important parameter in depositing dense and hard amorphous carbon films, as opposed to graphitic carbon films which are relatively soft, is to bombard the surface of the film during growth with energetic ions or atoms. Although it is not desired to be limited by theory, one might conjecture that the bombardment prevents the formation of extended graphitic regions and promotes the amorphous nature and random bonding in the solid. Also, although many other deposition techniques have been reported, these films are generally deposited by known methods including sputtering or by plasma enhanced chemical vapor deposition (PECVD) as disclosed in scientific publications, such as by Jansen et al. in the *Journal of Vacuum Science and Technology* A3,605,1985, the disclosure of which is totally incorporated herein by reference, and the references contained therein, the disclosures of which are totally incorporated herein by reference. Sputtering can be referred to as a thin film deposition technique in which a condensable vapor stream is created by physically removing atoms and molecules from a solid slab or disc, designated a "target". With carbon films, the target is often high purity graphite. The target is bombarded by inert gas ions and atoms of a sufficiently high energy, typically 1,000 eV, to effect the removal of the target material. The vapor stream from the target is intercepted by a substrate on which the sputtered material condenses and the film is formed. Several different sputtering techniques can be distinguished according to the details of how the energetic inert gas atoms are obtained. Direct current and radio-frequency sputtering in parallel plate systems have been used but suffer from the problem that the sputter efficiencies for carbon are very low. Magnetic fields can be used to confine the electrons close to the target and to create intense plasmas. Such magnetically enhanced discharges allow the deposition of carbon films at higher rates. There is evidence that a fraction of both the carbon as well as the inert gas atoms arrive at the substrate with considerable energy, thus creating conditions amenable to the growth of dense amorphous carbon films. In any of these configurations the substrate may also be biased to achieve further control over the energetic bombardment conditions during growth. Better control over the ion sputter energy is obtained when ions are generated and accelerated in ion guns. This mode of sputtering is generally referred to as ion beam sputtering. The growth environment at the substrate can be changed controllably by allowing ions either from the first or from a second ion gun to bombard the substrate during film growth. Generally, more ion bombardment results in a higher degree of departure from the graphitic structure and harder films. However, with more ion bombardment, the density of chemically unsaturated bonds also increases and the contact angle of the films with, for example, triply distilled water decreases. Control over the contact angle can be obtained when univalent bond saturating elements such as hydrogen or fluorine are incorporated with the carbon in the film structure. Any of the known sputter techniques can yield films which are composed of only carbon. By sputtering with gases which are reactive with carbon ("reactive" sputtering) one can change the chemical composition of the films in a controlled manner and therefore change the properties of the carbon films. The element that affects the properties of carbon films most profoundly appears to be hydrogen. Since hydrogen molecules are too light to effect sputtering, hydrogen gas is normally admixed with a heavier sputtering gas such as argon.

Hydrogenated or halogenated amorphous carbon films can also be deposited by known plasma enhanced chemical vapor deposition (PECVD). This method usually does not employ a solid form of carbon as the source material but rather carbon containing gases or vapors which are decomposed in a glow discharge ("plasma"). Condensation reactions at the surface of the growing film are thermally activated and are also affected by ion bombardment. PECVD reactors are often of the parallel plate type and excited by rf power, thus closely resembling a rf sputter configuration. Carbon films are deposited both on the grounded and the electrically powered electrode. In a symmetric system, the properties of the carbon films deposited on these electrodes are substantially identical. The dc self bias at the electrodes in such a system is one half of the amplitude of the rf voltage. However, bombardment energies of the film, both by ions as well as by neutral species, are normally only a fraction of this self bias due to collisions and charge exchange processes in the sheaths at the electrodes. Electrodes of different size often cause the film properties to differ as a result of the difference in the electrode self bias. These differences can be maximized by the insertion of a blocking capacitor in the electrical supply line to the smaller electrode. In this situation, a negative dc bias of approximately the amplitude of the applied, high, about 800 or more volts, frequency voltage can be obtained at this electrode whereas the bias at the large electrode is minimal, for example about 10 or more, such as 100 volts. Harder and less transparent carbon films with a lower hydrogen concentration are obtained at the powered electrode, when compared with the film deposited on the large electrode, due to the difference in bombardment conditions of the film during growth. Hydrogen and/or halogen, such as fluorine, need not be present uniformly throughout the film in order to increase the contact angle of the film; the presence of these elements in or at the surface or a near surface layer is sufficient in an embodiment of the present invention. Thus, optimization of, for instance, the mechanical properties of the film can be accomplished by growing the film under conditions of high ion bombardment and to separately increase the contact angle by exposing the surface of the bond-defective film to a plasma containing hydrogen or fluorine atoms. In such a way, hydrophobic films which are also mechanically hard are obtained although these properties might seem mutually exclusive.

One specific coating selected for the process of the present invention and prepared as illustrated herein, or obtained from commercial sources, is diamond-like carbon, which is comprised of amorphous carbon with from about 2 to about 40 weight percent, and preferably with from 10 to 20 weight percent of a halogen or hydrogen present. These carbon films exhibit diamond-like properties and because of their hardness they cannot easily be scratched by a stainless steel stylus pressed by hand against the surface and traversed under considerable force over the surface. The monovalent element, such as hydrogen or halogen like fluorine, saturates the dangling bonds both in the material as well as its surface. The surface energy is, therefore, reduced and the surface will react to the presence of any other substance, such as water or ink, as a repellent. These properties render these films a preferred material for the coating of orifice plates for ink jet printers. Hydrogen and/or fluorine can be incorporated in the material when PECVD is used as the deposition technique for the diamond-like carbon films or when the surface of a carbon film is exposed to a plasma containing hydrogen and/or fluorine atoms, especially when the level of bond saturation is not high enough as, for instance, deduced from the observation of relatively small contact angles, 80°. This treatment method is highly effective in increasing the contact angles and employs, for example, the exposure of the surface of the coating to a low power density plasma of, for instance, $CF_4$ or $H_2$. Such a treatment does not deposit a coating but merely modifies the physical and chemical properties of the exposed surface by the saturation of dangling bonds. Particularly, fluorine treatment of the surface is effective in increasing the contact angles to desirable values of greater than 90°. Also, fluorinated surfaces, such as Teflon, which are chemically relatively inert, can be selected as the coatings to impart nonstick properties to these surfaces.

Specifically, in an embodiment of the present invention the deposition and bond passivation treatment by plasma exposure to the halogen, such as fluorine or hydrogen plasma, can be performed in a relatively simple known PECVD apparatus schematically represented in FIG. 1.

FIG. 1 illustrates a device and process that may be selected for the preparation of the coatings of the present invention in an embodiment thereof. This figure illustrates a vacuum chamber 1 with electrodes 3 and 5 comprised of a metal such as aluminum or stainless steel, which electrodes are usually water cooled, and wherein the electrodes are connected to a vacuum pump, not shown; a gas inlet means 7; a gas exhaust means 9; the component to be coated 11 contained on electrode 5; electrical power source 15; a plasma 17; a voltage controller 19 wherein the electrical power is applied to either the upper or the lower electrode, or both electrodes if desired; and wherein the electrical chamber is grounded.

Carbonaceous gases such as hydrocarbon gases of which methane, ethane and acetylene are examples are useful precursor materials for the deposition of carbon coatings with diamond-like properties. Fluorinated gases are also useful but often require the presence of hydrogen to react with the fluorine so that a film deposits rather than being immediately etched away by the fluorine. With hydrocarbon gases, hydrogenated amorphous carbon films are formed, which have a hydrogen content of from about 5 to about 40 percent and preferably from about 5 to about 15 percent of hydrogen bonded to the carbon. With halogenated gases, such as fluorocarbon gases, fluorinated amorphous carbon films are formed which have a fluorine content of from about 5 to about 20 weight percent, and preferably from about 5 to about 15 weight percent of fluorine bonded to the carbon. Hydrocarbon or fluorocarbon gases are flowed through the system, reference FIG. 1, for example, preferably in the abundant presence of an inert gas such as argon, for example in a 1:10 ration and at total flow rates which are about 1 standard liter per minute. These films are deposited at relatively low temperatures of from room temperature to about 100° C. by decomposing the gas mixture by electrical power. Both direct current as well as rf voltage can be supplied to one of the electrodes but the hardest films are formed on the electrode with the negative bias. Typical power densities are of the order of from 0.01 to 1 $mW/cm^2$ for both rf or dc power. The films formed are amorphous and growth rates with the process are typically from about 0.1 to 1 micron per hour. The surface properties can be improved by exposing the surface to a monovalent gas such as hydrogen or fluorine, and more specifically exposing the surface to a plasma of hydrogen or $CF_4$ for a time period of about 10 to 20 minutes, for example.

Specifically, commerical PECVD reactor systems such as the PlasmaTherm 700 system made by Plasma Therm Corporation, available from Voorhees, N.J. and the Plasmox system, available from CVC from Rochester, N.Y., reference FIG. 1, are examples of useful reactor systems that can be used to deposit the coatings on the front face of a thermal ink jet device. Total gas flows into these systems during deposition can be set at 300 standard cubic centimeters per minute (sccm) at all the different cycles. Initially, a cleaning and descumming mixture of 50 percent of argon and 50 percent of nitrous oxide is introduced into the reaction chamber, and the pressure is stabilized at 150 mTorr. Radiofrequent power (13.56 MHs) is applied at a power density of 0.05 mW/cm$^2$ to the electrode on which the thermal ink jet heads rest. The opposing electrode is grounded and both electrodes are water cooled. The plasma which results from the application of the electrical power is continued for a period of 20 minutes. All the gases are then pumped from the chamber and a mixture of 50 percent of argon and 50 percent of hydrogen is introduced and the pressure is stabilized at 150 mTorr. Radiofrequent power (13.56 MHs) is again applied at a power density of 0.1 mW/cm$^2$ to the electrode on which, for example, the thermal ink jet heads rest. The opposing electrode is grounded and both electrodes are water cooled. The plasma which results from the application of the electrical power is continued for a period of 10 minutes. These procedures ensure that the front face is descummed and prepared in a reproducible state of cleanliness, ready to receive the coating. After all the gases are pumped from the chamber, a mixture of 95 percent of argon and 5 percent of acetylene was introduced therein and the pressure is stabilized at 100 mTorr. Radiofrequent power (13.56 MHs) was again applied at a power density of 0.1 mW/cm$^2$ to the electrode on which the thermal ink jet heads rest. The opposing electrode was grounded and both electrodes were water cooled. The plasma 17, which results from the application of the electrical power, was continued for a period of 30 minutes. After all the gases were pumped from the chamber, a carbon tetrafluoride gas was introduced and the pressure was stabilized at 200 mTorr. Radiofrequent power (13.56 MHs) was again applied at a power density of 0.01 mW/cm$^2$ to the electrode on which the thermal ink jet heads rest. The opposing electrode was grounded. The plasma, which results from the application of the electrical power, was continued for a period of 30 minutes. Upon removal of the generated coated sample products, it was found that they evidence excellent desired high contact angles both with triply distilled water and different inks that were included in the test. The resulting cooled ink jet devices were then incorporated as print heads in an experimental ink jet printer, which had the capability to supply pulsed electrical power to the print head and traverse the print head in a direction parallel to the paper towards which the ink was directed, and were tested for directionality and lifetime. It was found that directionality of the ink drops was improved for every ink channel as the ink pattern on the paper matches the channel configuration of the head geometrically. Specifically, for a single heating pulse applied to each of the 192 channels of the device without moving the head, a corresponding pattern of 192 marks equally spaced and in a straight line was found on the paper. This is to be contrasted with the results of the same test before the hydrophobic front face coating was applied. In this situation, many of the drops were not on a straight line and many drops were partially or completely overlapping. This misguided drop pattern severely impacts the quality of printed text in that characters have ragged appearing edges. This problem is resolved with the coatings of the present invention. The device lifetime and directionality performance was not limited by the front face coating as devices still print with all channels at the target specification of 50 million pulses per channel with a directionality pattern that cannot be distinguished from the first print.

The following examples are being submitted to further define various species of the present invention. These examples are intended to be illustrative only and are not intended to limit the scope of the present invention. Also, parts and percentages are by weight unless otherwise indicated.

EXAMPLE I

A PlasmaTherm 700 system obtained from Plasma Therm Corporation of Voorhees, N.J. was used to deposit hydrophobic diamond-like carbon coatings on the front face of thermal ink jet head devices as follows. One thousand devices in robotically loaded antistatic packs were placed on the lower electrode of the system upon which the system was closed and pumped down to full evacuation. Initially, a cleaning and descumming mixture of 50 percent of argon and 50 percent of nitrous oxide was introduced into the 700 device and the pressure was stabilized at 150 mTorr by suitable throttling of the vacuum pumps. Total gas flows into the deposition system during all treatment and deposition steps were 300 standard cubic centimeters per minute (sccm) at all the different cycles. A radiofrequent power 13.56 MHs was applied at a power density of 0.05 mW/cm$^2$ to the lower electrode on which the thermal ink jet heads rest. The opposing electrode was grounded and both electrodes were water cooled. The plasma which results from the application of the electrical power was continued for a period of 20 minutes. Then all the gases were pumped from the chamber and a mixture of 50 percent of argon and 50 percent of hydrogen was introduced and the pressure was stabilized at 150 mTorr. Radiofrequent power was then applied, now at a power density of 0.1 mW/cm$^2$, to the electrode on which the thermal ink jet heads rest. The opposing electrode was grounded and both electrodes were water cooled. The plasma which results from the application of the electrical power was continued for a period of 10 minutes. These procedures insure that the ink jet head front face was descummed and prepared in a reproducible state of cleanliness, ready to receive the coating. After all the gases were pumped from the chamber, a mixture of 95 percent of argon and 5 percent of acetylene was introduced and the pressure was stabilized at 100 mTorr. Radiofrequent power (13.56 MHs) was applied at a power density of 0.1 mW/cm$^2$ to the electrode on which the thermal ink jet heads rest. The opposing electrode was grounded and both electrodes were water cooled. The plasma which resulted from the application of the electrical power was continued for a period of 30 minutes. After all the gases were pumped from the chamber, 300 sccm of $CF_4$ was introduced and the pressure was stabilized at 200 mTorr. Radiofrequent power (13.56 MHs) was applied at a power density of 0.01 mW/cm$^2$ to the aluminum electrode on which the thermal ink jet heads rest. The opposing aluminum electrode was grounded. The plasma which resulted from the application of the electrical power was continued for a period of 3 minutes. Upon removal of a coated thermal ink jet head sample, it was found that it evidenced excellent high contact angles with triply distilled water of about 105° (increased from about 60° ±5 to 100° ±5. Auger analysis showed that the surface of the ink jet head device had fluorine bonded to it. The ink jet devices were then incorporated as print heads in an experimental printing device and were tested for directionality and lifetime. The print station was capable of delivering electrical pulses of 40 volts to each of the heaters of the thermal print head device and of transporting paper at a constant speed in front of the device at a distance of 50 thousands of an inch away from the front face where the coating was applied. The paper speed was fully adjustable from 0 to 10 inches per second. The ink used for these tests was a dye based ink composed of 5 percent by weight of a black food dye in solution with equal parts (50) of water and ethylene glycol. At periodic intervals of every two minutes of continuous printing, the front face of the ink jet head devices was mechanically wiped by a blotter composed of lint free cloth. It was found that the directionality of the ink drops was vastly improved over the uncoated version of the same device. The directionality was determined by the channel direction and not by the details of the channel orifice through which the ink leaves the channnel. Specifically, for a single heating pulse of 40 V (volts) applied to each of the 192 channels of the device without moving the head, a corresponding pattern of 192 marks equally spaced and in a straight line was found on the paper. This is to be compared with the results of the same test before the above hydrophobic ink jet head front face coating was applied. In this situation, many of the drops were not on a straight line and many drops were partially or completely overlapping. This misguided drop ejection pattern severely impacted the quality of printed text in that characters had ragged appearing edges. This problem was resolved with the coatings, and in this instance the above coating, of the present invention. The device lifetime and directionality performance was not limited by the front face coating as devices still printed with all channels at the target specification of 50 million pulses per channel with a directionality pattern that could not be distinguished from the first print.

EXAMPLE II

A PlasmaTherm 700 system obtained from Plasma Therm Corporation of Voorhees, N.J. was used to deposit hydrophobic diamond-like carbon coatings on the front face of thermal ink jet devices as follows. One thousand devices in robotically loaded antistatic packs were placed on the lower electrode of the system, and the system was closed and pumped down to full evacuation. Initially, a cleaning and descumming mixture of 50 percent of argon and 50 percent of nitrous oxide was introduced and the pressure was stabilized at 150 mTorr by suitable throttling of the vacuum pumps. Total gas flow into the system during all treatment and deposition steps was 300 standard cubic centimeters per minute (sccm) at all the different cycles. Radiofrequent power (3.56 MHs) was applied at a power density of 0.05 mW/cm$^2$ to the lower electrode on which the thermal ink jet heads rest. The opposing electrode was grounded and both electrodes were water cooled. The plasma which results from the application of the electrical power was continued for a period of 20 minutes. Then all the gases were pumped from the chamber and a mixture of 50 percent of argon and 50 percent of hydrogen was introduced, and the pressure was stabilized at 150 mTorr. Again, radiofrequent power was applied at a power density of 0.1 mW/cm$^2$ to the electrode on which the thermal ink jet heads rest. The opposing electrode was grounded and both electrodes were water cooled. The plasma which resulted from the application of the electrical power was continued for a period of 10 minutes. These procedures insured that the ink jet head front face was descummed and prepared in a reproducible state of cleanliness, ready to receive the coating. After all the gases were pumped from the chamber, a mixture of 50 percent of argon and 50 percent of methane was introduced and the pressure was stabilized at 200 mTorr. Radiofrequent power (13.56 MHs) was applied at a power density of 0.05 mW/cm$^2$ to the electrode on which the thermal ink jet heads rested. The opposing electrode was grounded and both electrodes were water cooled. The plasma which resulted from the application of the electrical power was continued for a period of 40 minutes. Upon removal of a coated thermal ink jet head sample, it was found that this sample evidenced excellent high contact angles both with triply distilled water and different inks that were included in the test. These inks were all based on food dyes in solution with a 1:1 mixture of water and ethylene glycol. Standard analytical tests showed that the coating consisted of carbon with hydrogen bonded to it. About 40 percent of the hydrogen present was bonded as the monohydride (C—H) to carbon, whereas an almost equal amount was bonded as the dihydride (C—H$_2$). The rest (20 percent) of the hydrogen was bonded as CH$_3$. The ink jet devices were incorporated as print heads in laboratory ink jet devices and were tested for directionality and lifetime. At periodic intervals, namely every two minutes of continuous ink jet printing, the front face of the ink jet head devices was mechanically wiped by a blotter composed of lint free cloth. It was found that the directionality of the ink drops was vastly improved over the uncoated version of the same device. The directionality was determined by the channel direction and not the details of the channel orifice through which the ink leaves the channel. Specifically, for a single heating pulse of 40 V applied to each of the 192 channels of the above device without moving the head, a corresponding pattern of 192 marks equally spaced and in a straight line was found on the paper. This was to be compared with the results of the same test before the hydrophobic front face coating was applied. In this case, many of the drops were not on a straight line and many drops were partially or completely overlapping. This misguided drop ejection pattern severely impacted the quality of printed text in that characters had ragged appearing edges. This problem was resolved with the coatings, and in this instance the above coating, of the present invention. The device lifetime and directionality performance was not limited by the front face coating in any way as devices still printed with all channels at the target specification of 50 million pulses per channel with a directionality pattern that could not be distinguished from the first print.

Although the invention has been described with reference to specific preferred embodiments, it is not intended to be limited thereto; rather those skilled in the art will recognize variations and modifications may be made therein which are within the spirit of the present invention and within the scope of the following claims.

What is claimed is:

1. A process for minimizing or avoiding drop deflection in ink jet devices which comprises the steps of: coating ink jet head components of said ink jet devices with hydrogenated amorphous carbon and subsequently subjecting said hydrogenated amorphous carbon to fluorination whereby there results a fluorine surface layer present on said hydrogenated amorphous carbon coating thereby preventing drop deflection.

2. A process in accordance with claim 1 wherein the hydrogenated amorphous carbon contains from about 1 to about 40 weight percent of hydrogen.

3. A process in accordance with claim 1 wherein the flourine surface layer is of a thickness of about 1,000 Angstroms.

4. A process in accordance with claim 1 wherein the hydrogenated amorphous carbon coating is of a thickness of from about 100 Angstroms to about 10 microns.

5. A process in accordance with claim 3 wherein the coating is of a thickness of from about 100 Angstroms to about 10 microns.

6. A process in accordance with claim 1 wherein the hydrogenated amorphous carbon coating is applied by sputtering.

7. A process in accordance with claim 1 wherein the hydrogenated amorphous carbon coating is applied by plasma enhanced chemical vapor deposition techniques.

8. A process for avoiding or minimizing a deflection of ink droplets in an ink jet printing apparatus which comprises the steps of: coating ink jet head components of said ink jet printing apparatus with a amorphous carbon coating which comprises incorporating the components on a substrate into a deposition system; applying a vacuum of from about 1 mTorr to about 1 Torr; heating the substrate to a temperature of from about room temperature to about 300° C.; introducing into the deposition system a mixture of gases or vapors comprised of at least one carbon containing gas; adjusting a total pressure of the deposition system to from about 1 mTorr to about 1 Torr; activating the gas mixture in a plasma; and subsequently subjecting the formed amorphous carbon coating to fluorination whereby there results fluorine present on a surface of said amorphous carbon coating thereby preventing drop deflection.

9. A process in accordance with claim 8 wherein the ink jet head component is an ink jet print head assembly.

10. A process for minimizing drop deflection in ink jet devices which comprises the steps of: coating ink jet head components of said ink jet devices with a material selected from the group consisting of amorphous carbon, and hydrogenated amorphous carbon; and subsequently fluorinating said amorphous carbon or said hydrogenated amorphous carbon wherein there is formed on a surfaces thereof a layer of fluorine atoms thereby preventing drop deflection.

11. A process in accordance with claim 10 wherein the hydrogenated amorphous carbon contains from 1 to about 60 weight percent of hydrogen.

12. A process in accordance with claim 10 wherein said fluorinating is accomplished with $CF_4$.

13. A process for avoiding drop deflection in ink jet devices which comprises the steps of: coating ink jet head components of said ink jet devices with a material selected from the group consisting of amorphous carbon, and hydrogenated amorphous carbon, subsequently subjecting said amorphous carbon or said hydrogenated amorphous carbon to fluorination thereby preventing drop deflection.

14. A process in accordance with claim 13 wherein said fluorination is accomplished with $CF_4$.

15. A process in accordance with claim 1 wherein said fluorinating is accomplished with $CF_4$.

16. A process in accordance with claim 1 wherein prior to coating the ink jet head components with said hydrogenated amorphous carbon the ink jet heads are subjected to cleaning.

17. A process in accordance with claim 16 wherein cleaning is effected with argon and nitrous oxide.

18. A process in accordance with claim 1 wherein fluorine is bonded to the hydrogenated amorphous carbon coating.

* * * * *